United States Patent [19]

Richards, II et al.

[11] Patent Number: 5,689,194

[45] Date of Patent: Nov. 18, 1997

[54] ACOUSTIC MOTOR CURRENT SIGNATURE ANALYSIS SYSTEM WITH AUDIO AMPLIFIED SPEAKER OUTPUT

[75] Inventors: Reginald D. Richards, II; Robert T. Proffitt, both of Lynchburg; Anthony F. Lexa, Forest, all of Va.

[73] Assignee: Framatome Technologies, Inc., Lynchburg, Va.

[21] Appl. No.: 635,360

[22] Filed: Apr. 19, 1996

[51] Int. Cl.$^6$ ............................................. G01R 23/16
[52] U.S. Cl. .................. 324/772; 318/490; 340/648
[58] Field of Search ........................... 324/772; 318/245, 318/490; 340/648

[56] References Cited

U.S. PATENT DOCUMENTS

| | | | |
|---|---|---|---|
| 4,413,325 | 11/1983 | Elfner et al. | 364/557 |
| 4,678,990 | 7/1987 | Bicknell et al. | 324/158 |
| 4,922,195 | 5/1990 | Cox | 324/158 |
| 4,965,513 | 10/1990 | Haynes et al. | 324/158 |
| 4,978,909 | 12/1990 | Hendrix et al. | 324/77 |
| 5,137,029 | 8/1992 | Parra | 128/745 |
| 5,200,816 | 4/1993 | Rose | 358/80 |
| 5,216,337 | 6/1993 | Orton et al. | 318/16 |
| 5,233,354 | 8/1993 | Roth et al. | 342/160 |
| 5,333,240 | 7/1994 | Matsuoto et al. | 395/23 |
| 5,365,158 | 11/1994 | Tanaka et al. | 318/806 |
| 5,420,523 | 5/1995 | Walker et al. | 324/772 |
| 5,578,937 | 11/1996 | Haynes et al. | 324/772 |

OTHER PUBLICATIONS

Kafi Korsah, Oak Ridge National Laboratory and Robert E. Uhrig, Oak Ridge National Laboratory & The University of Tennessee, Paper presented at the Sixth Specialists Meeting on Reactor Noise, Gatlingburg, TN, "Investigation of Neural Network Paradigms for the Development of Automatic Noise Diagnostic/Reactor Surveillance Systems" May 19–24, 1991.

Michael Tinston, U.S. Navy, Antal A. Sarkady, U.S. Naval Academy, Diane R. Porter, Naval Surface Warfare Center, "Motor Current Analysis for the Diagnosis of Air compressor Defects".

Steve Smith, Oak Ridge National Laboratory, summary of the modulation theory from a report written for the Navy, Nov. 1, 1995.

*Primary Examiner*—Sandra L. O'Shea
*Assistant Examiner*—Barry C. Bowser
*Attorney, Agent, or Firm*—Rhodes Coats & Bennett, L.L.P.

[57] ABSTRACT

An apparatus for monitoring and processing of motor currents to determine motor characteristics under various loads. In the preferred embodiment, the invention employs a spectrum analyzer that having a plurality of digitally controlled switched capacitor filters under control of a personal computer. Sampling of both voltage and current simultaneously allows for calculation of instantaneous motor power and power factor, which are used to monitor the motor's performance. An acoustical output, generated under computer control is used to give the operator feedback on the motor's operation. The output signal is derived from low frequency or infrasonic sensing and is then stepped up to a frequency that the operator can hear. This permits the analyst to "hear" the condition of the motor under load. A CRT display to show the frequency spectrum and time display.

25 Claims, 1 Drawing Sheet

ACOUSTIC MOTOR CURRENT SIGNATURE ANALYSIS SYSTEM WITH AUDIO AMPLIFIED SPEAKER OUTPUT

BACKGROUND OF THE INVENTION (1) Field of the Invention

The present invention relates generally to an acoustic motor current signature analysis system and, more particularly, to a system for translating motor current signature signals to an audible output.

(2) Description of the Prior Art

There has been considerable recent interest in the general area known as motor current signature analysis (MCSA). This technology deals with special monitoring and processing of motor currents to determine characteristics of a motor and its mechanical load. The motor acts like a transducer which takes electrical energy and converts it into mechanical energy to drive mechanical load. Variations in the mechanical load and changes within the motor are reflected in the motor current. By using special detection circuits and processing techniques, these small variations of motor current can be captured and analyzed. This information provides very useful and descriptive information about the conditions of the combined motor and mechanical load.

The motor current contains motor current noise from various sources. It has been found that the motor current noise includes the sum of all the mechanical load changes which refer back to the electric motor drive. These are separated on a frequency and amplitude basis such that the source of various changes in load may be identified such as periodic gear mesh loading, friction events at frequencies corresponding to their origin, and other motor load varying characteristics of the device. Thus, motor current noise signatures taken at different periods during the operating life of the device help determine aging and wear or abnormal operating characteristics. The relative magnitude of the electric noise signal generated by a particular mechanical noise source will depend on its absolute magnitude and on its mechanical linkage to the motor which remains a fixed relationship for a given device. The motor itself acts as a transducer changing the mechanical load variations into electrical noise.

Currently, there is no easy, human friendly way to quickly check the status of a motor and load using MCSA. Typically, an MCSA analysis requires examination of time and frequency domain plots. The equipment associated with such an analysis is not only bulky, expensive and time-consuming to use, but makes it virtually impossible to run a quick "health check" of a particular motor and load.

Furthermore, given the large amount of information held within the motor current noise signals, there is a need to provide high performance filtering circuits to improve MCSA discrimination.

U.S. Pat. No. 4,965,513, issued to Haynes et al., discloses the broad concept of signal analysis of motor currents in an analog system performing a spectrum analysis of the voltage in the currents.

U.S. Pat. No. 4,922,195, issued to Cox, discloses a digital filter system for indicating failures in a generator system by employing switched capacitor filters.

U.S. Pat. No. 4,678,990, issued to Bicknell et al., generally discloses a motor monitor signal analysis system employing a multiplexer and memory system.

U.S. Pat. No. 5,216,337, issued to Orton et al., was noted as having an audible feedback signal for motor speed control. However, the use as a signal to determine the motor/load failures or problems does not appear to be taught.

U.S. Pat. No. 5,137,029, issued to Parra, is of interest because it teaches the concept of stepping up an infrasonic signal into an audible signal that can be heard.

U.S. Pat. No. 5,200,816, issued to Rose.; U.S. Pat. No. 5,233,354, issued to Roth et al.; and U.S. Pat. No. 5,333,240, issued to Matsumoto et al., broadly disclose the use of neural networks in spectrum analysis techniques but their patents do not appear to be related to motor diagnosis.

U.S. Pat. No. 5,365,158, issued to Tanaka et al., discloses a neural network employed in a motor driving control apparatus.

While Haynes does teach an analog MCSA system, it lacks the PC control via switch capacitor filters from spectrum analysis as well as the acoustic output for operator analysis. Furthermore, the prior art does not show the combination of digital filters under computer control with an acoustic output for motor diagnostics. Thus, there remains a need for a new and improved way to quickly provide an MCSA health check in a human-friendly manner while, at the same time, providing improved MCSA discrimination.

SUMMARY OF THE INVENTION

The present invention is directed to an apparatus for monitoring and processing of motor currents to determine motor characteristics under various loads. In the preferred embodiment, the invention employs a spectrum analyzer that having a plurality of digitally controlled switched capacitor filters under control of a personal computer. Sampling of both voltage and current simultaneously allows for calculation of instantaneous motor power and power factor, which are used to monitor the motor's performance. An acoustical output, generated under computer control is used to give the operator feedback on the motor's operation. The output signal is derived from low frequency or infrasonic sensing and is then stepped up to a frequency that the operator can hear. This permits the analyst to "hear" the condition of the motor under load.

Accordingly, one aspect of the present invention is to provide a motor current signature analysis system including: (a) a motor current sensor for sensing motor current and providing a motor current noise signal; (b) a signal processor having a means for selecting a portion of the motor current noise signal and a means for converting the portion of the motor current noise signal into an audio signal within an audible frequency range; and (c) an audio section including an amplifier and a speaker coupled to the amplifier, wherein the amplifier amplifies the audio signal and transfers the amplified audio signal to the speaker for playing the selected frequencies of the motor current noise signal.

Another aspect of the present invention is to provide a signal processor for a motor current signature analysis system including: (a) an input for receiving a motor current noise signal; (b) a demodulator for demodulating the motor current noise signal; (c) a signal conditioner having filters for selecting predetermined frequencies of the motor current noise and removing unwanted frequencies and harmonics from the motor current noise signal; (d) a signal translator for shifting the selected frequencies of the motor current noise signal into an audio bandwidth; and (e) an audio section having an amplifier and a speaker coupled to the amplifier for amplifying and playing the selected frequencies of the motor current noise signal.

Still another aspect of the present invention is to provide a motor current signature analysis system including: (a) a motor current sensor for sensing motor current and providing a motor current noise signal; (b) a signal processor including: (i) an input for receiving the motor current noise signal; (ii) a demodulator for demodulating the motor current noise signal; (iii) a signal conditioner having at least one digital filter for selecting predetermined frequencies of the motor current noise and removing unwanted frequencies and harmonics from the motor current noise signal; and (iv) a signal translator for shifting the selected frequencies of the motor current noise signal into an audio bandwidth signal; and (c) an audio section including an amplifier and a speaker coupled to the amplifier, wherein the amplifier amplifies the audio bandwidth signal and transfers the amplified audio bandwidth signal to the speaker for playing the selected frequencies of the motor current noise signal.

These and other aspects of the present invention will become apparent to those skilled in the art after a reading of the following description of the preferred embodiment when considered with the drawings.

DESCRIPTION OF THE PREFERRED EMBODIMENTS

Figure 1:
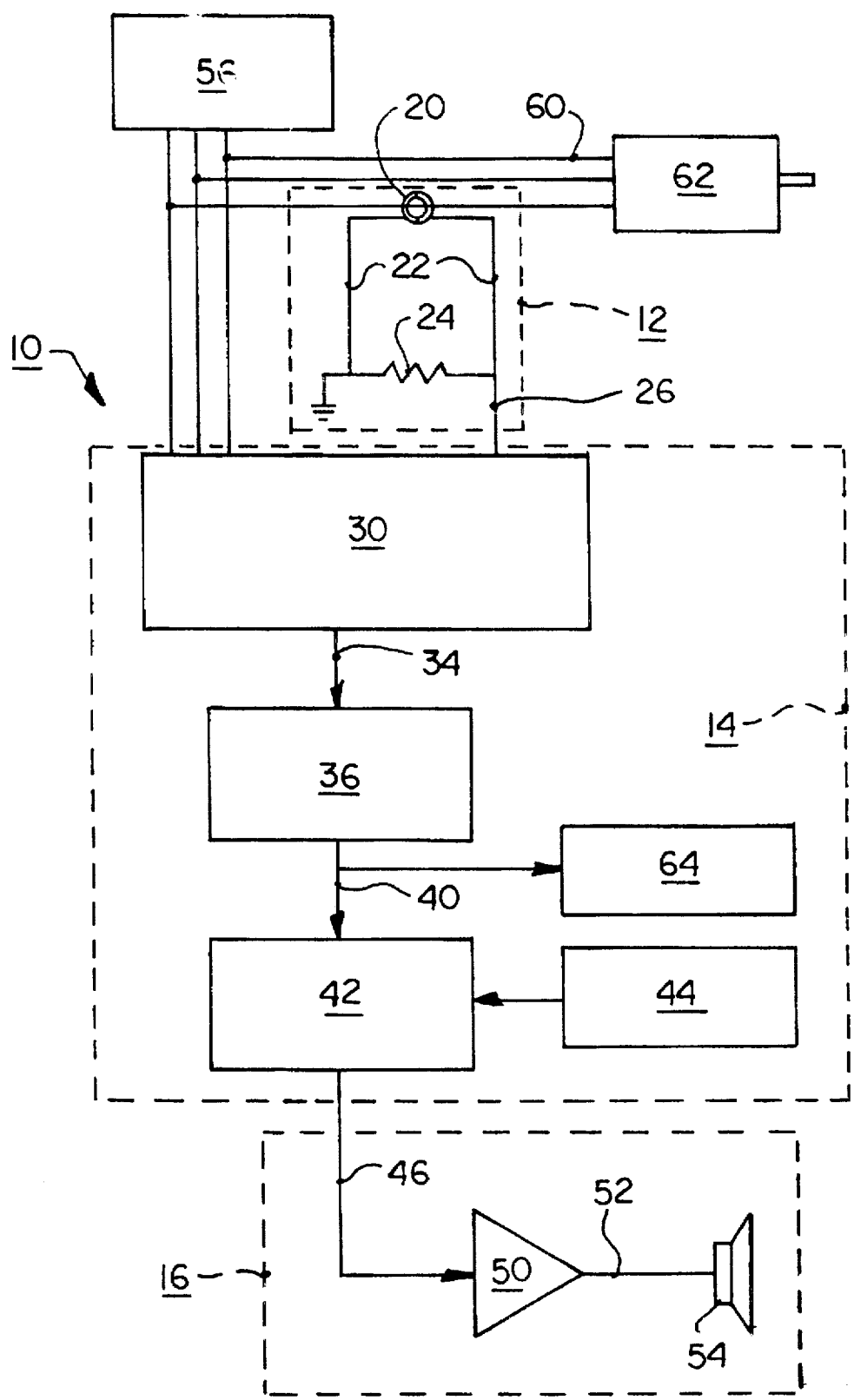
FIG. 1 is a block diagram of an acoustic motor current signature analysis system constructed according to the present invention.

In the following description, like reference characters designate like or corresponding parts throughout the several views. Also in the following description, it is to be understood that such terms as "forward", "rearward", "left", "right", "upwardly", "downwardly", and the like are words of convenience and are not to be construed as limiting terms.

Referring now to the drawing, it will be understood that the illustrations are for the purpose of describing a preferred embodiment of the invention and are not intended to limit the invention thereto. As best seen in FIG. 1, an acoustic motor current signature analysis system, generally designated 10, is shown constructed according to the present invention. The acoustic motor current signature analysis system 10 includes three major sub-assemblies: a sensor 12; a signal processing system 14; and an audio section 16.

Generally, a motor 62 is powered by a power supply 56 through power cables 60. The sensor 12 generally includes a current transformer 20, leads 22, and a load resistor 24. The current transformer 20 may be placed anywhere along the motor cable 60. The current transformer 20 will provide a variable current signal proportional to the time bearing current flowing in the current transformer lead 22. The variable current signal in the lead 22, when connected across load resistor 24, will generate a varying voltage across the resistor 24 which is proportional to the motor current. The voltage signal 26 developed across the load resistor 24 is sent to the signal processing system 14.

The signal processing system includes primarily the demodulator 30, the signal conditioner 36, and the signal translator 42. The voltage signal 26 is demodulated by the demodulator 30. The demodulator 30 may be an RMS-to-DC converter which produces a voltage proportional to the root means square (RMS) value of the motor current signal. The demodulation may be amplitude or phase demodulation. The demodulated signal 34 is then sent to the signal conditioning section 36 of the signal processing system 14.

The signal conditioner 36 preferably includes various filters having frequency cutoffs set to remove unwanted spectra associated with frequencies and harmonics unapplicable to the motor current noise analysis; for example, the 60 hertz line frequency and its harmonics. However, the filters may be configured and controlled in a manner allowing the selection and suppression of various frequencies and harmonics to focus in on a particular frequency or harmonic. In certain cases, a particular frequency corresponding to a gear meshing signal may be focused in on while removing information associated with other motor components. Changing the filter cutoff points allows the system to focus on one or more of the various frequency components of the motor current signal like motor slip, rotational speed, drive belt speed, etc.

In the preferred embodiment, the filter is a digital filter utilizing switched capacitor technology. Switched capacitor filters allow implementation of superior filter performance in a small package. The cutoff frequency of these filters can be adjusted over a wide band by a computer controlled clock frequency. Additionally, switched capacitor filters provide the capability of designing very precise filters with relatively inexpensive parts.

The demodulated and conditioned motor current signal 40 is made up of the chosen frequency components like slip, rotational speed, drive belt speed, etc. These frequencies are usually below approximately 50 hertz and are not detectable by the human ear. The demodulated and conditioned signal 40 is sent to the signal translator 42 and translated into a frequency range which is audible. The signal translator 42 may use an associated oscillator 44 to form a standard heterodyne circuit. The heterodyne circuit multiplies the demodulated and conditioned signal 40 with a sine wave oscillator 44. For example, a 400 hertz sine wave oscillator will multiply a 5 hertz slip into 405 hertz and 395 hertz, upper and lower side band tones. The audible tones will vary proportionally to various motor and load frequencies.

The audible MCSA signal 46 is amplified by the audio amplifier 50 and the amplified audio signal 52 is sent to a speaker 54. The human ear is very sensitive in detecting subtle changes in audio signatures. Providing audible feedback of various MCSA frequency components will allow a systems analyst to run a quick check of the motor and load health. The analyst will be able to select the frequency components like slip, rotational speed, drive belt speed, and various other components by selecting the appropriate filter setting in the signal conditioner 36. Preferably, these selections will be made under computer control to facilitate ease of use and provide greater flexibility.

The various motor current signal analysis signals may also be archived or stored on a data recorder 64, such as a PC based high-speed multichannel data acquisition system. Storing the data allows the analyst to compare the present data with the archive data to detect any trends or changes in the MCSA data. The MCSA data may also be viewed or recorded on various machinery monitors or storage units to allow more detailed analysis in conjunction with the audio information.

In operation, the motor current sensor senses the motor current and provides a motor current noise signal to the signal processor. The signal processor receives the motor current noise signal and demodulates the motor current noise signal. The signal conditioner selects predetermined frequencies of the motor current noise and removes unwanted frequencies and harmonics from the motor current noise signal. The signal translator shifts the selected frequencies of the motor current noise signal into an audio bandwidth signal. Finally, the amplifier amplifies the audio bandwidth signal and transfers the amplified audio bandwidth signal to the speaker for playing the selected frequencies of the motor current noise signal.

Certain modifications and improvements will occur to those skilled in the art upon a reading of the foregoing description. By way of example, combining time histories and frequency plots of power and power factor; setting alert and alarm levels as a function of frequency to monitor a specific machine; and overlaying historical plots for a given machine to show trends. Also, neural network software may also be utilized to analyze the stored information in a manner to allow the software to "learn" how to recognize a condition of interest occurring in the MCSA data and automatically provide and alert the analyst when the problem exists or occurs. It should be understood that all such modifications and improvements have been deleted herein for the sake of conciseness and readability but are properly within the scope of the following claims.

We claim:

1. A motor current signature analysis system comprising:
   (a) a motor current sensor for sensing motor current and providing a motor current noise signal, said sensor having an motor current noise signal output;
   (b) a signal processor having a means for selecting a portion of said motor current noise signal and a means for converting said portion of said motor current noise signal into an audio signal within an audible frequency range, said signal processor having an input for receiving said motor current noise signal and an audio signal output; and
   (c) an audio section including an amplifier and a speaker coupled to said amplifier, said amplifier having an input for receiving said audio signal, wherein said amplifier amplifies said audio signal and transfers the amplified audio signal to said speaker for playing said selected frequencies of said motor current noise signal.

2. The apparatus according to claim 1 wherein said means for selecting a portion of said motor current noise signal further includes at least one digital filter.

3. The apparatus according to claim 2 wherein said digital filters are switched capacitor filters.

4. The apparatus according to claim 2 wherein said digital filters are computer controlled.

5. The apparatus according to claim 1 wherein said motor current sensor is a current transformer.

6. A signal processor for a motor current signature analysis system comprising:
   (a) an input for receiving a motor current noise signal;
   (b) a demodulator for demodulating said motor current noise signal;
   (c) a signal conditioner having filters for selecting predetermined frequencies of said motor current noise and removing unwanted frequencies and harmonics from said motor current noise signal;
   (d) a signal translator for shifting said selected frequencies of said motor current noise signal into an audio bandwidth; and
   (e) an audio section having an amplifier and a speaker coupled to said amplifier for amplifying and playing said selected frequencies of said motor current noise signal.

7. The apparatus according to claim 6 wherein said signal translator is a heterodyne circuit.

8. The apparatus according to claim 6 wherein said heterodyne circuit multiplies said selected frequencies of said motor current noise signal with a sine wave oscillator.

9. The apparatus according to claim 6 further comprising a recorder for recording said motor current noise signal.

10. The apparatus according to claim 6 wherein said demodulator uses a demodulation technique selected from the group consisting of amplitude and phase demodulation.

11. The apparatus according to claim 6 wherein said filters are controllable by a computer.

12. A motor current signature analysis system comprising:
    (a) a motor current sensor for sensing motor current and providing a motor current noise signal, said sensor having an motor current noise signal output;
    (b) a signal processor including: (i) an input for receiving said motor current noise signal; (ii) a demodulator for demodulating said motor current noise signal; (iii) a signal conditioner having at least one digital filter for selecting predetermined frequencies of said motor current noise and removing unwanted frequencies and harmonics from said motor current noise signal; and (iv) a signal translator for shifting said selected frequencies of said motor current noise signal into an audio bandwidth signal; and
    (c) an audio section including an amplifier and a speaker coupled to said amplifier, said amplifier having an input for receiving said audio bandwidth signal, wherein said amplifier amplifies said audio bandwidth signal and transfers the amplified audio bandwidth signal to said speaker for playing said selected frequencies of said motor current noise signal.

13. The apparatus according to claim 12 wherein said digital filters are switched capacitor filters.

14. The apparatus according to claim 12 wherein said digital filters are computer controlled.

15. The apparatus according to claim 12 wherein said motor current sensor is a current transformer.

16. The apparatus according to claim 12 wherein said signal translator is a heterodyne circuit.

17. The apparatus according to claim 12 wherein said heterodyne circuit multiplies said selected frequencies of said motor current noise signal with a sine wave oscillator.

18. The apparatus according to claim 12 further comprising a data recorder for recording said motor current and motor current noise signal.

19. The apparatus according to claim 12 wherein said demodulator uses a demodulation technique selected from the group consisting of amplitude and phase demodulation.

20. The apparatus according to claim 12 wherein said filters are controllable by a computer.

21. The apparatus according to claim 1 wherein said motor current sensor is a hall effect current sensor.

22. The apparatus according to claim 12 wherein said motor current sensor is a hall effect current sensor.

23. A method for analyzing a motor current signature, said method comprising the steps of:
    (a) sensing motor current and providing a motor current noise signal by a motor current sensor, said sensor having an motor current noise signal output;
    (b) processing said motor current noise signal output by a signal processor having a means for selecting a portion of said motor current noise signal and a means for converting said portion of said motor current noise signal into an audio signal within an audible frequency range, said signal processor having an input for receiving said motor current noise signal and an audio signal output; and
    (c) amplifying said audio signal output by an audio section including an amplifier and a speaker coupled to said amplifier, said amplifier having an input for receiving said audio signal, wherein said amplifier amplifies said audio signal and transfers the amplified audio signal to said speaker for playing said selected frequencies of said motor current noise signal.

24. A method for signal processing for analyzing a motor current signature, said method comprising the steps of:

(a) receiving a motor current noise signal;

(b) demodulating said motor current noise signal;

(c) signal conditioning said motor current noise signal by a signal conditioner having filters for selecting predetermined frequencies of said motor current noise and removing unwanted frequencies and harmonics from said motor current noise signal;

(d) shifting said selected frequencies of said motor current noise signal into an audio bandwidth by a signal translator; and (e) amplifying said shifted signal by an audio section having an amplifier and a speaker coupled to said amplifier for amplifying and playing said selected frequencies of said motor current noise signal.

25. A method for analyzing a motor current signature, said method comprising the steps of:

(a) sensing motor current and providing a motor current noise signal by a motor current sensor, said sensor having an motor current noise signal output;

(b) processing said motor current noise signal output by a signal processor including: (i) an input for receiving said motor current noise signal; (ii) a demodulator for demodulating said motor current noise signal; (iii) a signal conditioner having at least one digital filter for selecting predetermined frequencies of said motor current noise and removing unwanted frequencies and harmonics from said motor current noise signal; and (iv) a signal translator for shifting said selected frequencies of said motor current noise signal into an audio bandwidth signal; and (c) amplifying said shifted signal by an audio section including an amplifier and a speaker coupled to said amplifier, said amplifier having an input for receiving said audio bandwidth signal, wherein said amplifier amplifies said audio bandwidth signal and transfers the amplified audio bandwidth signal to said speaker for playing said selected frequencies of said motor current noise signal.

\* \* \* \* \*